(12) United States Patent
Wang

(10) Patent No.: US 8,950,062 B1
(45) Date of Patent: Feb. 10, 2015

(54) SCREW LOCKING TOOL

(71) Applicant: Wistron Corporation, New Taipei (TW)

(72) Inventor: Yun-Jun Wang, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 0 days.

(21) Appl. No.: 14/205,379

(22) Filed: Mar. 12, 2014

(30) Foreign Application Priority Data

Oct. 31, 2013 (CN) .......................... 2013 1 0533317

(51) Int. Cl.
*B23P 19/00* (2006.01)
*H05K 13/00* (2006.01)

(52) U.S. Cl.
CPC .................................. *H05K 13/0015* (2013.01)
USPC .................................. 29/764; 29/773; 29/787

(58) Field of Classification Search
CPC .................. H01L 23/4006; H01L 2023/4087; H01L 23/40
USPC ............ 29/764, 773, 787, 795; 257/718, 719, 257/E23.084, E23.086
See application file for complete search history.

(56) References Cited

U.S. PATENT DOCUMENTS

| 7,349,218 B2 * | 3/2008 | Lu et al. .................... 361/679.32 |
| 7,505,271 B2 * | 3/2009 | Chen ............................. 361/704 |

* cited by examiner

*Primary Examiner* — Thiem Phan
(74) *Attorney, Agent, or Firm* — Winston Hsu; Scott Margo

(57) ABSTRACT

A screw locking tool is used for performing a screw locking operation of an electronic device. The electronic device has a screw hole. The screw locking tool includes a baseboard, a hollow frame, a guide rod, and a sleeve member. The baseboard has a containing space for containing the electronic device. The hollow frame is movably disposed on the baseboard. The guide rod is disposed in the hollow frame and has a guide slot formed thereon. The sleeve member is movably disposed through the guide slot and has a guide hole. The sleeve member is used for moving along a first direction to a position where the guide hole is aligned with the screw hole when the electronic device is contained in the containing space and the hollow frame covers the baseboard, so as to guide a screw to be screwed in the screw hole through the guide hole.

11 Claims, 5 Drawing Sheets

SCREW LOCKING TOOL

BACKGROUND OF THE INVENTION

1. Field of the Invention

The present invention relates to a tool, and more specifically, to a screw locking tool for performing a screw locking operation of an electronic device.

2. Description of the Prior Art

In general, a conventional electronic device usually adopts a screw locking method to fix its electronic components or fix itself to another electronic device. For example, a heat dissipating device is mounted on a main board in a screw locking manner. However, during the screw locking process, an operator usually utilizes a screwdriver (e.g. an electric screwdriver) to perform the screw aligning and locking operations. Thus, it may cause a time consuming and strenuous screw aligning process, and damage of the electronic device due to accidental impact caused by inappropriate operations of the operator may occur easily.

SUMMARY OF THE INVENTION

An objective of the present invention is to provide a screw locking tool for performing a screw locking operation of an electronic device, to solve the aforesaid problem.

The present invention provides a screw locking tool for performing a screw locking operation of at least one electronic device. The at least one electronic device has at least one screw hole. The screw locking tool includes a baseboard, a hollow frame, at least one guide rod, and at least one sleeve member. The baseboard has a containing space for containing the at least one electronic device. The hollow frame is movably disposed on the baseboard. The at least one guide rod is disposed in the hollow frame and has a guide slot formed thereon. The at least one sleeve member is movably disposed through the guide slot and has a guide hole. The least one sleeve member is for moving along a first direction to a position where the guide hole is aligned with the at least one screw hole when the at least one electronic device is contained in the containing space and the hollow frame covers the baseboard to make the guide slot of the at least one guide rod aligned with the at least one screw hole, so as to guide a screw to be screwed in the screw hole through the guide hole.

In summary, the present invention adopts assembly of the guide rod and the sleeve member, to allow a user to precisely screw the screw into the corresponding screw hole without performing additional screw aligning operation. In such a manner, the screw locking tool of the present invention could help the user quickly complete the screw locking operation of the electronic device for saving time. Furthermore, via the protection deign in which the screw needs to pass through the guide hole and then is screwed into the screw hole, the screw locking tool of the present invention could effectively solve the prior art problem that damage of the electronic device may occur due to accidental impact of the screw locking tool.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
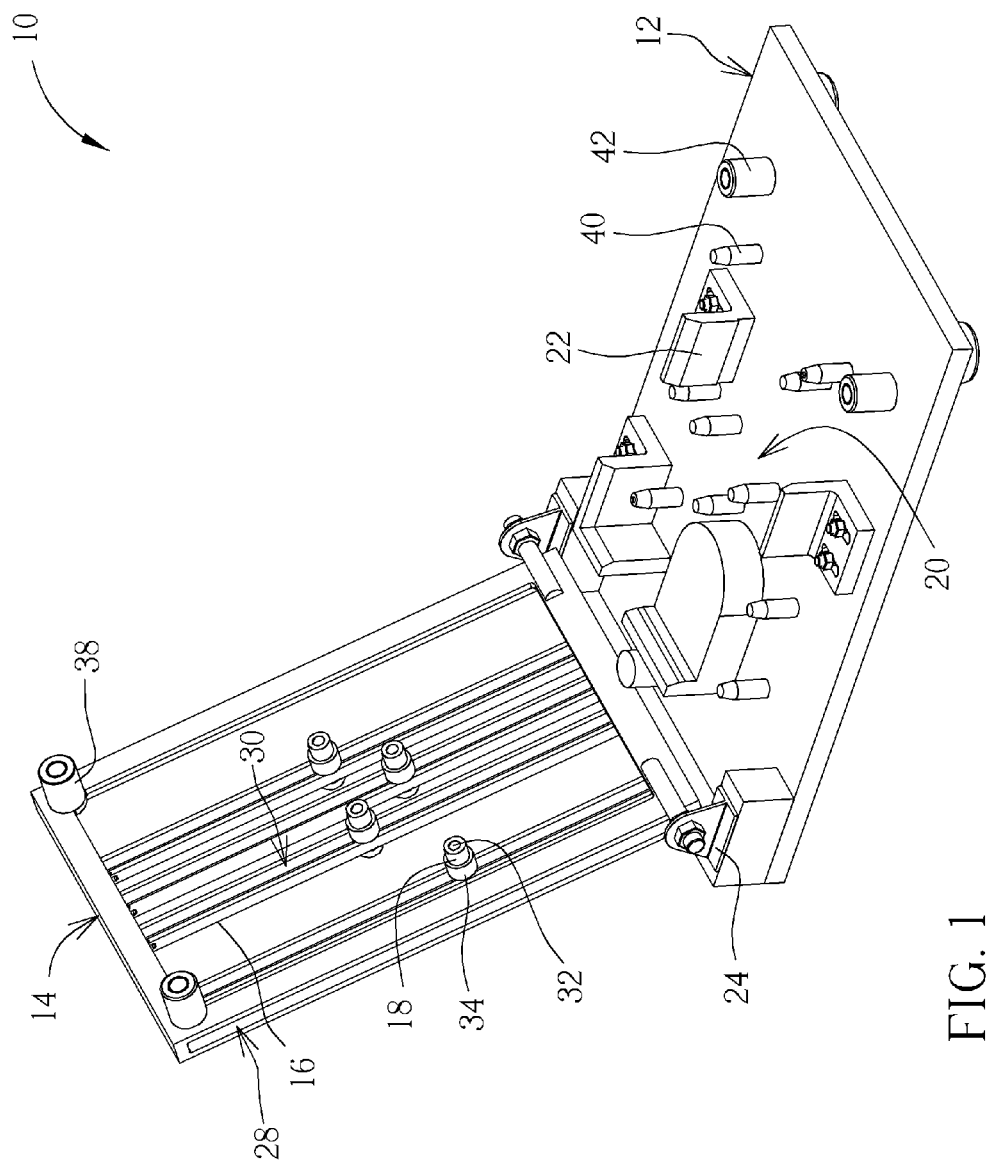
FIG. 1 is a diagram of a screw locking tool according to an embodiment of the present invention.
Figure 2:
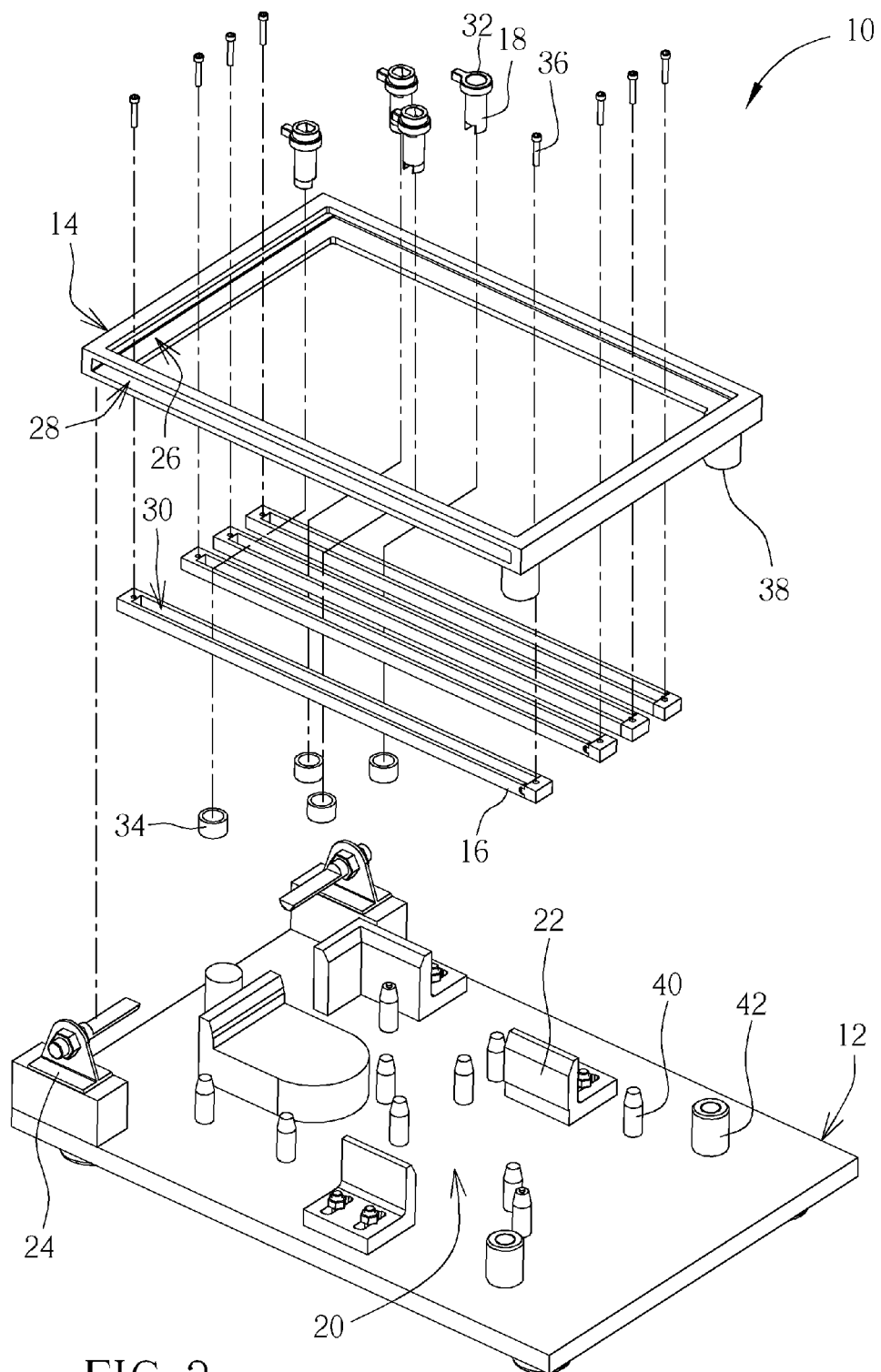
FIG. 2 is an exploded diagram of the screw locking tool in FIG. 1.

Please refer to FIG. 1 and FIG. 2. FIG. 1 is a diagram of a screw locking tool 10 according to an embodiment of the present invention. FIG. 2 is an exploded diagram of the screw locking tool 10 in FIG. 1. The screw locking tool 10 is used for performing the screw locking operation of an electronic device, such as fixing a heat dissipating device on a main board or fixing components of a tablet computer on itself. That is to say, the screw locking tool 10 could be utilized to perform the component fixing operation for one single electronic device or to fix more than two electronic devices to each other. As shown in FIG. 1 and FIG. 2, the screw locking tool 10 includes a baseboard 12, a hollow frame 14, at least one guide rod 16 (four shown in FIG. 2, but not limited thereto), and at least one sleeve member 18 (four shown in FIG. 2, but not limited thereto). The baseboard 12 has a containing space 20 for providing an electronic device containing function. In this embodiment, the screw locking tool 10 could further have a plurality of constraining blocks 22 (four shown in FIG. 2, but not limited thereto). The plurality of constraining blocks 22 could be utilized as the borders of the containing space 20 in a discontinuous arrangement so as to define the containing space 20, but not limited thereto. In other words, the baseboard 12 could adopt other space forming design commonly seen in the prior art, such as forming a containing groove or a containing wall on the baseboard 12. In practical application, the plurality of constraining blocks 22 could be movably disposed on the baseboard 12 to make the containing space 20 adjustable, so that the screw locking tool 10 could be suitable for electronic devices with different sizes.

The hollow frame 14 is preferably made of acrylonitrile butadiene styrene (ABS) material or plastic steel material (but not limited thereto), and is movably disposed on the baseboard 12 so that a user could utilize the hollow frame 14 to cover the baseboard 12 for performing a screw locking operation of an electronic device or detach the hollow frame 14 from the baseboard 12 for taking the electronic device contained in the containing space 20 from the baseboard 12. To be more specific, in this embodiment, the hollow frame 14 is pivoted to the baseboard 12 so that the hollow frame 14 could cover the baseboard 12 or be lifted from the baseboard 12 (as shown in FIG. 1). The related pivot design could be as shown in FIG. 1 (but not limited thereto). In this embodiment, the baseboard 12 could have at least one shaft base 24 (two shown in FIG. 1, but not limited thereto). A side of the hollow frame 14 is connected to the shaft base 24 so that the hollow frame 14 could be pivoted to the baseboard 12. To be noted, the design in which the hollow frame 14 is movable relative to the baseboard 12 could be not limited to the aforesaid embodiment. In other words, all designs in which the hollow frame 14 could selectively cover the baseboard 12 could be adopted by the present invention. For example, the hollow frame 14 could be detachably mounted on the baseboard 12 by structural engagement.

Furthermore, in this embodiment, a concave rail 26 could extend inwardly from the hollow frame 14 and the guide rod 16 could be movably inserted into the concave rail 26, so that the user could move the guide rod 16 relative to the hollow frame 14 to align with a screw hole of an electronic device contained in the containing space 20. In practical application, an installation opening 28 could be formed at a side of the hollow frame 14. Accordingly, the guide rod 16 could be disposed in the hollow frame 14 more conveniently by inserting into the concave rail 26 through the installation opening 28.

As for the design in the guide rod 16 and the sleeve member 18, as shown in FIG. 1 and FIG. 2, a guide slot 30 is formed on the guide rod 16, and the sleeve member 18 is movably disposed through the guide slot 30 and has a guide hole 32 so that the user could move the sleeve member 18 along the guide slot 30 of the guide rod 16 to make the guide hole 32 align with a screw hole of an electronic device contained in the containing space 20. The guide rod 16 could be preferably made of acrylonitrile butadiene styrene material or plastic steel material (but not limited thereto). The guide rod 16 could be an integrally-formed rod having the guide slot 30 formed thereon or could adopt the design in which the guide slot 30 could be formed by connecting two ends of one rod to two ends of another rod. The sleeve member 18 could be preferably made of rubber material, but not limited thereto. Furthermore, for positioning the guide rod 16 and the sleeve member 18 at the position aligning with a screw hole of an electronic device contained in the containing space 20, the screw locking tool 10 could utilize an auxiliary member to position the guide rod 16 and the sleeve member 18, but not limited thereto, meaning that the guide rod 16 and the sleeve member 18 could be positioned in the hollow frame 14 and the guide slot 30 respectively only in a tightly-fitting manner. For example, in this embodiment, the screw locking tool 10 could further include at least one positioning ring 34 (four shown in FIG. 2, but limited thereto) and at least one positioning rod 36 (eight shown in FIG. 2, but limited thereto). The positioning ring 34 could be disposed on the sleeve member 18 by a conventional sleeving design, such as a tightly-fitting design or a screw locking design, for positioning the sleeve member 18 in the guide slot 30. The positioning rod 36 passes through one end of the guide rod 16 to insert into the concave rail 26, so as to position the guide rod 16 in the hollow frame 14.

Furthermore, in this embodiment, the baseboard 12 could further have at least one first positioning pillar 38 (two shown in FIG. 2, but not limited thereto) and a plurality of support pillars 40. A second positioning pillar 42 extends from the hollow frame 14 corresponding to the first positioning pillar 38. The support pillar 40 is used for supporting an electronic device to make the electronic device contained in the containing space 20 more steadily. The second positioning pillar 42 could be detachably connected to the first positioning pillar 38 (e.g. by magnetic absorption or structural engagement) so that the hollow frame 14 could cover the baseboard 12 more steadily.

Figure 3:
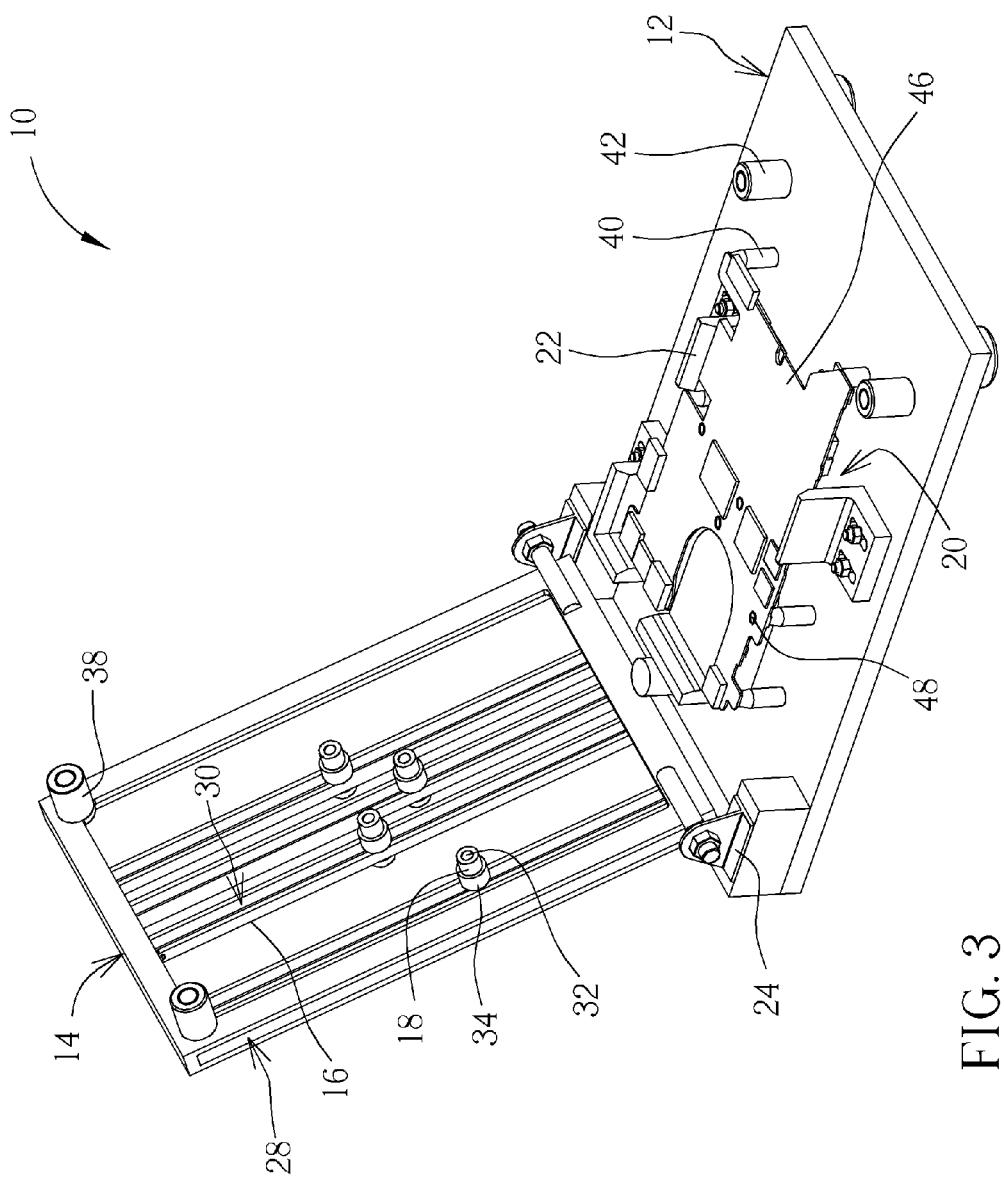
FIG. 3 is a diagram of a main board being contained in a containing space in FIG. 1.
Figure 4:
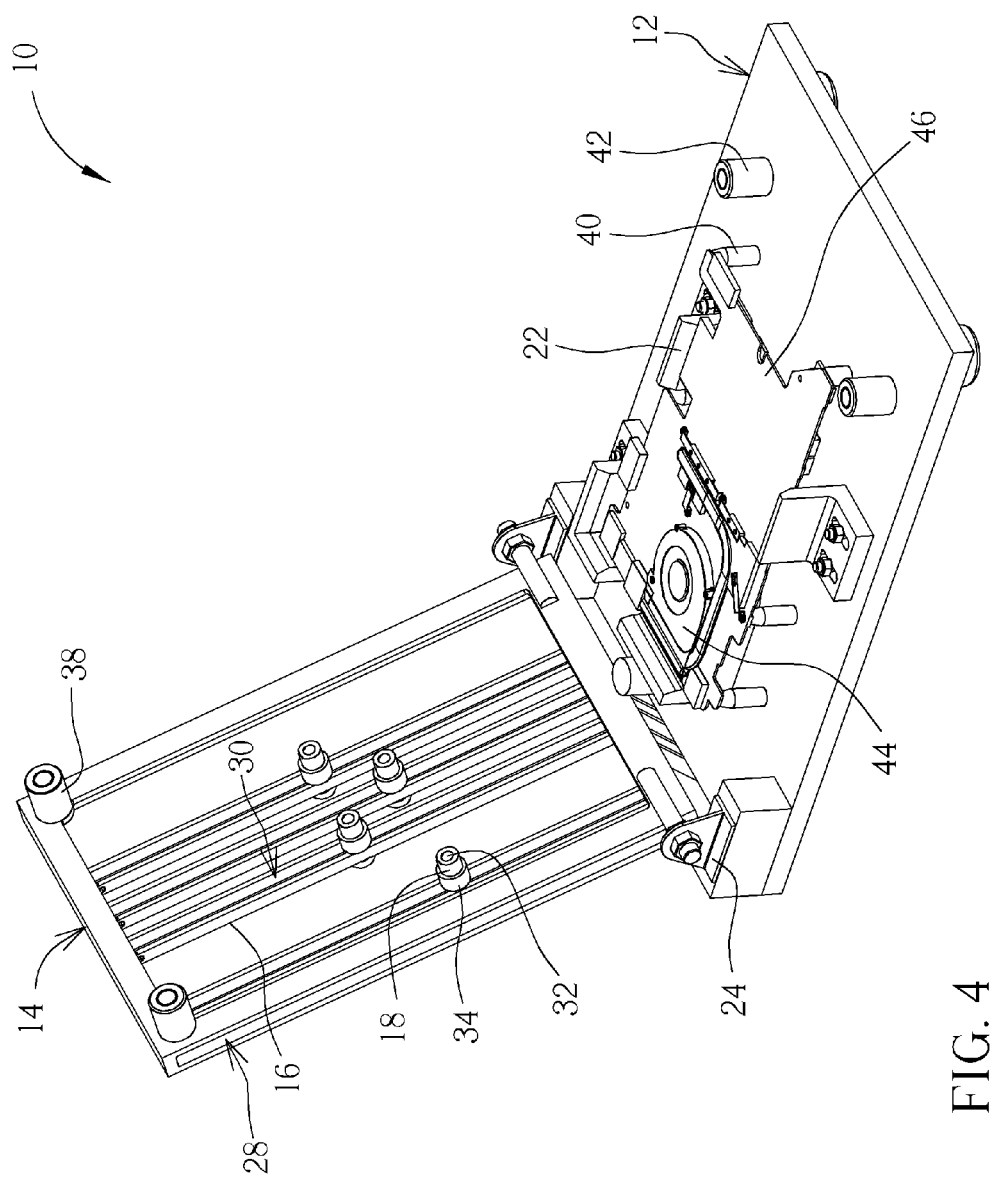
FIG. 4 is a diagram of a heat dissipating device being placed on the main board in FIG. 3.
Figure 5:
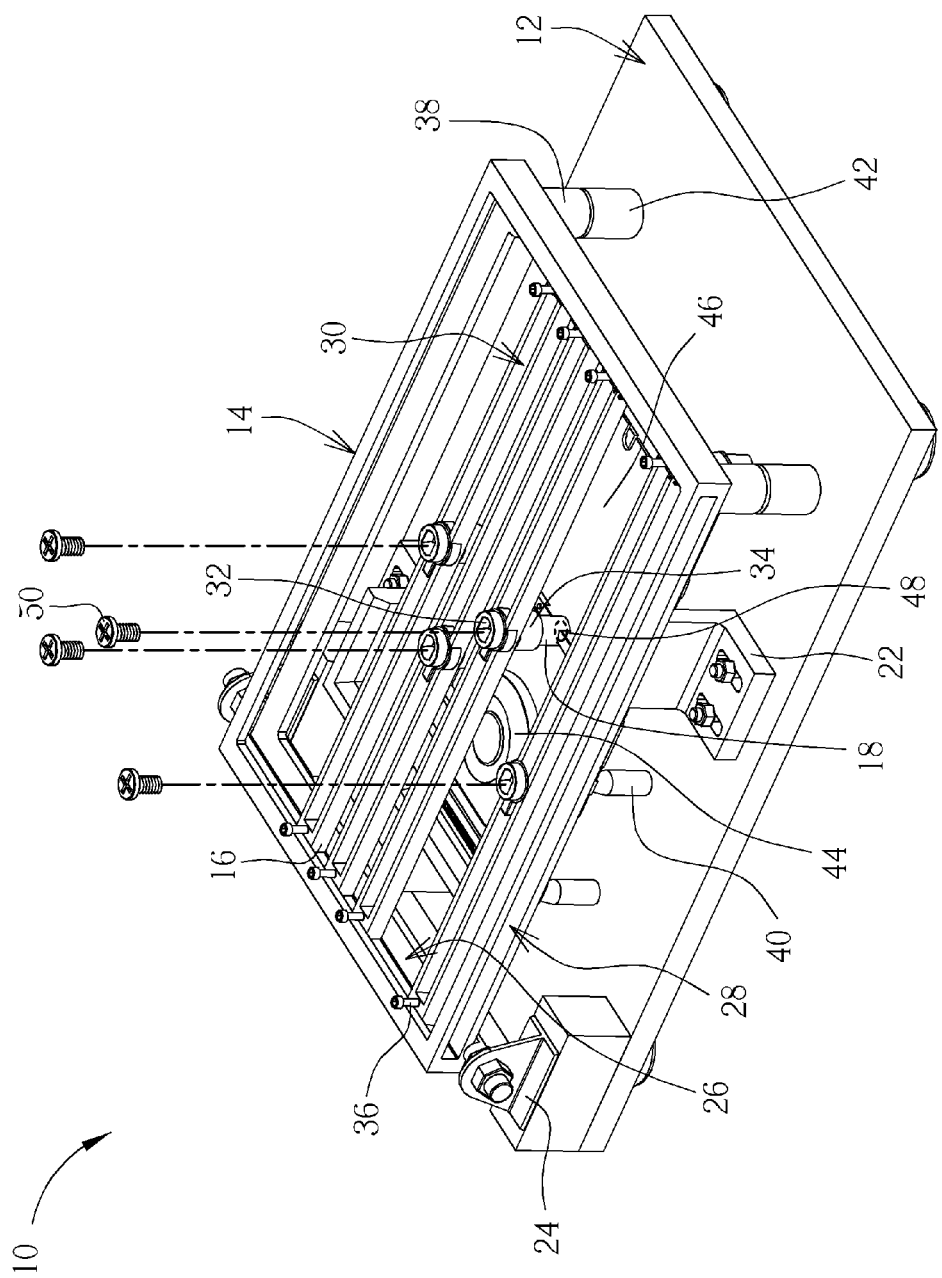
FIG. 5 is a diagram of a hollow frame in FIG. 4 rotating to cover a baseboard.

More detailed description for the screw locking operation of the screw locking tool 10 (e.g. fixing a heat dissipating device 44 on a main board 46) is provided as follows. Please refer to FIG. 1, FIG. 3, FIG. 4, and FIG. 5. FIG. 3 is a diagram of the main board 46 being contained in the containing space 20 in FIG. 1. FIG. 4 is a diagram of the heat dissipating device 44 being placed on the main board 46 in FIG. 3. FIG. 5 is a diagram of the hollow frame 14 in FIG. 4 rotating to cover the baseboard 12. The main board 46 has at least one screw hole 48 (four shown in FIG. 3, but not limited thereto) for locking the heat dissipating device 44 thereon. When a user wants to utilize the screw locking tool 10 to lock the heat dissipating device 44 on the main board 46, the user could place the main board 46 in the containing space 20 (as shown in FIG. 3) and then place the heat dissipating device 44 on a position of the main board 46 for installation of the heat dissipating device 46 (as shown in FIG. 4). Subsequently, the user could push the hollow frame 14 to make the hollow frame 14 rotate relative to the baseboard 12 from a position as shown in FIG. 4 to a position where the hollow frame 14 covers the baseboard 12, so that the user could perform the aligning operations of the guide rod 16 and the sleeve member 18 conveniently. Finally, after the user pushes the guide rod 16 along a Y-axis direction in FIG. 5 to a position aligning with the screw hole 48 of the main board 46 and then pushes the sleeve member 18 along an X-axis direction in FIG. 5 to a position where the guide hole 32 is aligned with the screw hole 48 (as shown in FIG. 5), the user could utilize a screwdriver (e.g. an electric screwdriver) to precisely screw each screw 50 as shown in FIG. 5 into the corresponding screw hole 48 through the corresponding guide hole 32 without performing additional screw aligning operation. Accordingly, the heat dissipating device 44 could be locked on the main board 46 so as to complete the screw locking operation of the screw locking tool 10.

On the other hand, when the user wants to detach the main board 46 having the heat dissipating device 44 locked thereon from the baseboard 12, the user just needs to lift the hollow frame 14 to rotate relative to the baseboard 12 from the position as shown in FIG. 5 to the position as shown in FIG. 4. At this time, since the hollow frame 14 no longer covers the baseboard 12, the user could detach the main board 46 having the heat dissipating device 44 locked thereon from the baseboard 12 easily, so that the user could continue to utilize the screw locking tool 10 to perform the subsequent screw locking operation.

It should be mentioned that the screw locking tool 10 of the present invention could adopt the design in which the sleeve member is movably disposed on the guide rod and the guide rod is fixed on the hollow frame to only have one-axial adjustment function, so as to simplify the mechanical design of the screw locking tool 10. As for which design is utilized, it depends on the practical application of the present invention.

Compared with the prior art, the present invention adopts assembly of the guide rod and the sleeve member, to allow the user to precisely screw the screw into the corresponding screw hole without performing additional screw aligning operation. In such a manner, the screw locking tool of the present invention could help the user quickly complete the screw locking operation of the electronic device for saving time. Furthermore, via the protection deign in which the screw needs to pass through the guide hole and then is screwed into the screw hole, the screw locking tool of the present invention could effectively solve the prior art problem that damage of the electronic device may occur due to accidental impact of the screw locking tool.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A screw locking tool for performing a screw locking operation of at least one electronic device, the at least one electronic device having at least one screw hole, the screw locking tool comprising:
    a baseboard having a containing space for containing the at least one electronic device;
    a hollow frame movably disposed on the baseboard;
    at least one guide rod disposed in the hollow frame and having a guide slot formed thereon; and at least one sleeve member movably disposed through the guide slot and having a guide hole, the least one sleeve member being for moving along a first direction to a position where the guide hole is aligned with the at least one screw hole when the at least one electronic device is contained in the containing space and the hollow frame covers the baseboard to make the guide slot of the at least one guide rod aligned with the at least one screw hole, so as to guide a screw to be screwed in the screw hole through the guide hole.

2. The screw locking tool of claim 1, wherein a concave rail extends inwardly from the hollow frame, the guide rod is movably inserted into the concave rail to make the guide rod capable of moving along a second direction relative to the hollow frame to a position where the guide slot is aligned with the at least one screw hole when the at least one electronic device is contained in the containing space and the hollow frame covers the baseboard, and the second direction is perpendicular to the first direction.

3. The screw locking tool of claim 2, wherein an installation opening is formed at a side of the hollow frame, and the guide rod is movably inserted into the concave rail after passing through the installation opening.

4. The screw locking tool of claim 2 further comprising:
at least one positioning rod passing through an end of the guide rod to insert into the concave rail, the at least one positioning rod being for positioning the guide rod at a position where the guide slot is aligned with the at least one screw hole.

5. The screw locking tool of claim 1, wherein the hollow frame is pivotally connected to the baseboard so that the hollow frame could be liftably disposed on the baseboard.

6. The screw locking tool of claim 5, wherein the baseboard has at least one shaft base, and a side of the hollow frame is connected to the shaft base to make the hollow frame pivoted to the baseboard.

7. The screw locking tool of claim 5, wherein the baseboard further has at least one first positioning pillar, a second positioning pillar extends from the hollow frame corresponding to the at least one first positioning pillar, and the second positioning pillar is detachably connected to the at least one first positioning pillar when the hollow frame rotates to cover the baseboard.

8. The screw locking tool of claim 7, wherein the second positioning pillar is detachably connected to the at least one first positioning pillar by magnetic absorption.

9. The screw locking tool of claim 1 further comprising:
at least one positioning ring sleeving the at least one sleeve member for positioning the at least one sleeve member on the guide slot of the guide rod.

10. The screw locking tool of claim 1 further comprising:
a plurality of constraining blocks movably disposed on the baseboard to define the containing space.

11. The screw locking tool of claim 1, wherein the baseboard further has a plurality of support pillars for supporting the at least one electronic device.

* * * * *